United States Patent
Joo et al.

(10) Patent No.: US 7,466,077 B2
(45) Date of Patent: Dec. 16, 2008

(54) FILTER ASSEMBLY, METHOD OF MANUFACTURING THE SAME, AND PLASMA DISPLAY PANEL USING THE SAME

(75) Inventors: Kyu-Nam Joo, Seoul (KR); Kwi-Seok Choi, Suwon-si (KR); Hyun-Ki Park, Seoul (KR); Myung-Dok Lim, Suwon-si (KR)

(73) Assignee: Samsung Corning Co., Ltd., Gyeonggi-do (KR)

( * ) Notice: Subject to any disclaimer, the term of this patent is extended or adjusted under 35 U.S.C. 154(b) by 557 days.

(21) Appl. No.: 11/035,896

(22) Filed: Jan. 18, 2005

(65) Prior Publication Data

US 2005/0156525 A1     Jul. 21, 2005

(30) Foreign Application Priority Data

Jan. 17, 2004  (KR) ................... 10-2004-0003582

(51) Int. Cl.
*H01J 17/49*  (2006.01)
*H01J 5/16*  (2006.01)

(52) U.S. Cl. ...................... 313/582; 313/112
(58) Field of Classification Search ............. 313/112, 313/582–587
See application file for complete search history.

(56) References Cited

U.S. PATENT DOCUMENTS

| | | |
|---|---|---|
| 5,541,618 A | 7/1996 | Shinoda |
| 5,661,500 A | 8/1997 | Shinoda et al. |
| 5,663,741 A | 9/1997 | Kanazawa |
| 5,674,553 A | 10/1997 | Sinoda et al. |
| 5,724,054 A | 3/1998 | Shinoda |
| 5,786,794 A | 7/1998 | Kishi et al. |

(Continued)

FOREIGN PATENT DOCUMENTS

JP     02-148645     6/1990

(Continued)

OTHER PUBLICATIONS

"*Final Draft International Standard*", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

*Primary Examiner*—Joseph L Williams
(74) *Attorney, Agent, or Firm*—McDermott Will & Emery LLP

(57) ABSTRACT

A filter assembly, a plasma display panel with the filter assembly and a method of manufacturing the filter assembly. The plasma display panel includes a panel assembly, a chassis base on which a driving circuit is mounted and located on a rear of the panel assembly, a filter assembly mounted in front of the panel assembly, and a case that accommodates the panel assembly, the chassis base, and the filter assembly. The filter assembly includes a transparent substrate, an anti-reflection film, and an electromagnetic wave shielding filter attached to the rear surface of the substrate, and the electromagnetic wave shielding filter is grounded to the inner side of the case and is made of a metal mesh that includes a plating layer and a strike seed layer.

11 Claims, 6 Drawing Sheets

U.S. PATENT DOCUMENTS

| | | |
|---|---|---|
| 5,952,782 A | 9/1999 | Nanto |
| RE37,444 E | 11/2001 | Kanazawa |
| 6,560,124 B1 * | 5/2003 | Irie et al. .................. 361/816 |
| 6,630,916 B1 | 10/2003 | Shinoda |
| 6,707,436 B2 | 3/2004 | Setoguchi et al. |
| 2003/0102790 A1 * | 6/2003 | Wachi et al. ............... 313/112 |

FOREIGN PATENT DOCUMENTS

| | | |
|---|---|---|
| JP | 2845183 | 10/1998 |
| JP | 2917279 | 4/1999 |
| JP | 2001-043804 | 2/2001 |
| JP | 2001-325888 | 11/2001 |

* cited by examiner

FILTER ASSEMBLY, METHOD OF MANUFACTURING THE SAME, AND PLASMA DISPLAY PANEL USING THE SAME

CLAIM OF PRIORITY

This application makes reference to, incorporates the same herein, and claims all benefits accruing under 35 U.S.C. §119 from an application for FILTER ASSEMBLY, METHOD OF MANUFACTURING THE SAME, AND PLASMA DISPLAY PANEL USING THE SAME earlier filed in the Korean Intellectual Property Office on 17 Jan. 2004 and there duly assigned Serial No. 10-2004-0003582.

BACKGROUND OF THE INVENTION

1. Field of the Invention

The present invention relates to a filter assembly for a plasma display panel that shields unwanted electromagnetic waves generated from the plasma display panel during driving thereof and a method of manufacturing the same.

2. Description of the Related Art

A plasma display panel (PDP) is a flat display device that displays images by using light emitted by ultraviolet rays generated in a discharge space filled with a discharge gas by applying a predetermined voltage to each of the electrodes formed on substrates facing each other.

When a plasma display panel is made, a filter must be put in place underneath the screen to prevent harmful electromagnetic radiation and electromagnetic interference (EMI) produced by the PDP from leaving the unit and causing problems. Ordinarily, the infra red radiation produced by the PDP needs to be screened in order to prevent disruption of infra red remote control devices located in the vicinity of the PDP. Neon light produced by the display needs to be filtered out to improve the integrity of the displayed image. Further, the electromagnetic interference (EMI) needs 9 to be filtered out to prevent the PDP from disrupting the operation of other electrical devices in the vicinity.

Often, the filter involves a transparent substrate with patterned metal thereon. However, such a structure is very difficult and expensive to make. What is needed is an improved method of making and an improved design for a filter for a PDP.

SUMMARY OF THE INVENTION

It is therefore an object of the present invention to provide an improved design for a filter for a plasma display panel.

It is also an object of the present invention to provide an improved method of making the filter for the plasma display panel.

It is further an object of the present invention to provide an inexpensive and simple method for making the filter for the plasma display panel.

These and other objects can be achieved by a filter assembly for a plasma display panel that is made of a substrate, and an electromagnetic wave shielding filter attached to the substrate and made of a polymer film and a plating layer of two separate layers formed in a mesh pattern on the polymer film. The plating layer is a double layer structure includes a strike layer and at least one plating layer on the strike layer.

The plating layer in a double layer structure is formed by preparing a metal plate for plating, forming the strike layer primarily on the metal plate, forming second a plating layer made of at least one layer on the upper surface of the strike layer, attaching a polymer film having high cohesiveness to an upper surface of the plating layer, and separating the polymer film from the metal plate resulting in the double layer structure being attached to the polymer film and no longer to the metal plate. In this process, the strike layer acts as a seed layer for the electrolytic plating. The strike layer is one or an alloyed combination of the following: Cu, Fe, Al, Zn, Co, Mg, Cr, Cd, Ti, Ag, Au, In. The plating layer is formed of copper or silver.

According to an aspect of the present invention, there is provided a plasma display panel that is made out of a panel assembly, a chassis base on a rear of the panel assembly, a driving circuit being mounted on a rear of the chassis base, a filter assembly mounted in front of the panel assembly, and a case that accommodates the panel assembly, the chassis base, and the filter assembly. The filter assembly includes a transparent substrate, an anti-reflection film preferably on the front of the substrate, and an electromagnetic wave shielding filter attached to the rear surface of the substrate. The electromagnetic wave shielding filter being electrically grounded to the inner side of the case, the electromagnetic wave shielding filter being a metal mesh that is a double layer structure. The double layer structure includes a strike layer and at least one plating layer on the strike layer.

The metal mesh is made by forming a double layer structure in a mesh shape first striking then plating, attaching a polymer film having high cohesiveness to the upper surface of the plating layer, and separating the polymer film from the metal plate so that the plating layer can be removed from the metal plate and be transferred to the lower surface of the polymer film.

According to an aspect of the present invention, there is provided a method of manufacturing a filter assembly for a plasma display panel, including preparing a metal plate for plating, forming a photoresist layer having a pattern corresponding to a mesh pattern on the upper surface of the metal plate, forming a strike layer on portions of the upper surface of the metal plate between regions on which the photoresist layers are formed, forming a plating layer made of at least one layer on the upper surface of the strike layer, removing the photoresist layer from the metal plate, attaching a polymer film having high cohesiveness on the metal plate having the plated mesh pattern, and separating the polymer film from the metal plate so that the plating layer is attached to a lower surface of the polymer film and not to the metal plate.

In preparing the metal plate, the metal plate for plating is made out of either SUS, titanium, nickel, aluminum, or alloys of these metals. In the forming of the strike layer which serves as a seed layer for electrolytic plating, the strike layer is formed of one or a combination of Cu, Fe, Al, Zn, Co, Mg, Cr, Cd, Ti, Ag, Au or In. In the forming of the strike layer, the electrolytic solution contains nickel chloride 30-70 g/L and hydrochloric acid 5-20 ml/L, and a current with density of 1-20 A/dm$^2$ for is applied 5-300 seconds. In the forming of the plating layer on the strike layer, the plating layer is formed of copper or silver.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
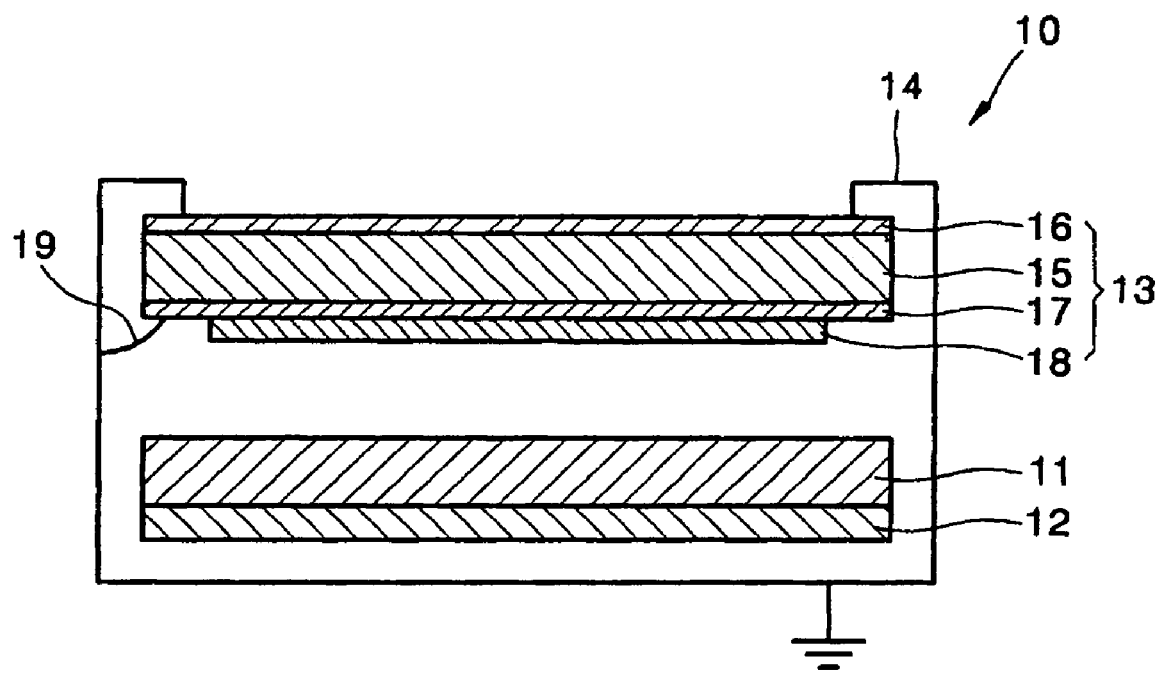
FIG. 1 is a cross-sectional view illustrating a plasma display panel.

Turning now to the figures, FIG. 1 is a cross-sectional view illustrating a plasma display panel 10. Referring to FIG. 1, the plasma display panel 10 includes a panel assembly 11, a chassis base 12 located on a rear surface of the panel assembly 11, a filter assembly 13 located on a front of the panel assembly 11, and a case 14 that accommodates the panel assembly 11, the chassis base 12, and the filter assembly 13.

When driving the plasma display panel 10, electromagnetic waves, infrared rays, and neon rays with a wavelength of 590 nm are emitted. At this time, unwanted electromagnetic waves must be shielded since they are harmful to the human body. The infrared rays must be shielded since they cause malfunctions in portable electronic devices such as remote control devices. The neon rays with a wavelength of 590 nm have to be shielded to improve image quality. Also, an anti-reflection process is needed to prevent the reduction of visibility due to reflection off the screen by external light.

The filter assembly 13, which performs all the functions described above, includes a glass or plastic substrate 15, an anti-reflection film 16 attached to a front surface of the substrate 15, an electromagnetic wave shielding filter 17 attached on a rear surface of the substrate 15, and a selected wave absorption film 18 attached on a rear surface of the electromagnetic wave shielding filter 17.

The filter assembly 13 is manufactured such that the electromagnetic wave shielding filter 17 formed of a conductive film or a metal mesh is attached on a surface of the transparent substrate 15, and the anti-reflection film 16 and the selected wave absorption film 18 are sequentially attached to the substrate 15. The electromagnetic wave shielding filter 17 is electrically grounded by connecting to a chassis in the case through a conductive line 19. The electromagnetic wave shielding filter 17 for shielding electromagnetic waves generated by plasma emission and circuits that drive of the plasma display panel 10 are formed by etching a metal thin film. However, the etching method has a high production cost due to the etching equipment and a high failure rate.

To overcome these drawbacks, the process for forming the electromagnetic wave shielding filter 17 can be simplified by forming the filter in a plated mesh shape. However, the plating method uses a metal plate in a plating process. An oxide film can be formed on a surface of the metal plate when the metal plate is reused. The oxide film is generated by exposing the metal plate to acid or to an atmosphere environment during a washing process, a plating process, or while moving it from one process to another.

The oxidation on the surface of the metal plate acts as a fine barrier hindering plating thereon. The oxide on the metal plate also reduces the quality of the plated layer by, for example, reducing a tightness of the plating layer resulting in a loose texture of the plating layer. To remove the oxide layer, a mechanical method can be used. However, there is high possibility of damaging the metal plate, thus reducing the density of the plating layer.

Figure 2A:
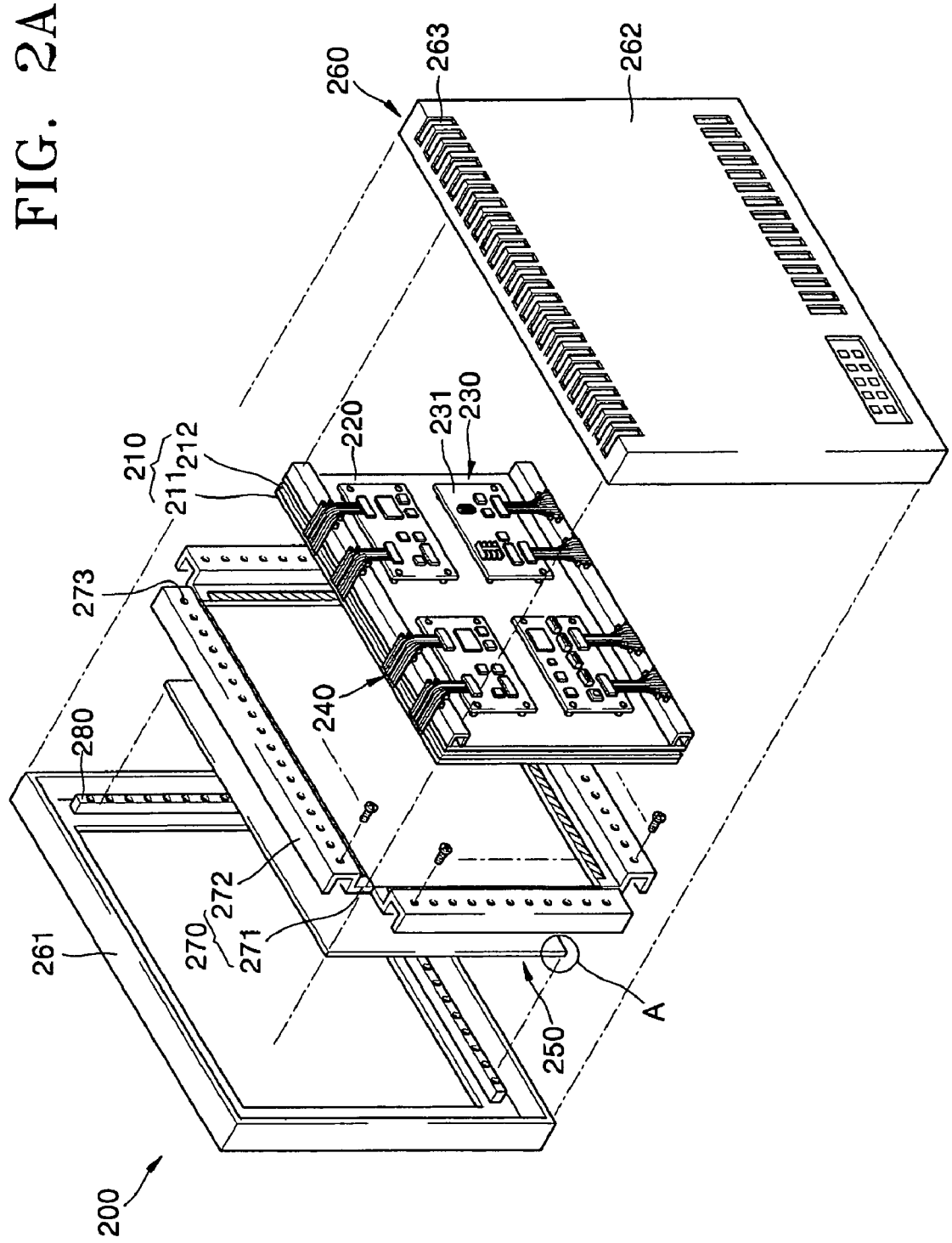
FIG. 2A is an exploded perspective view of a plasma display panel according to an embodiment of the present invention.
Figure 2B:
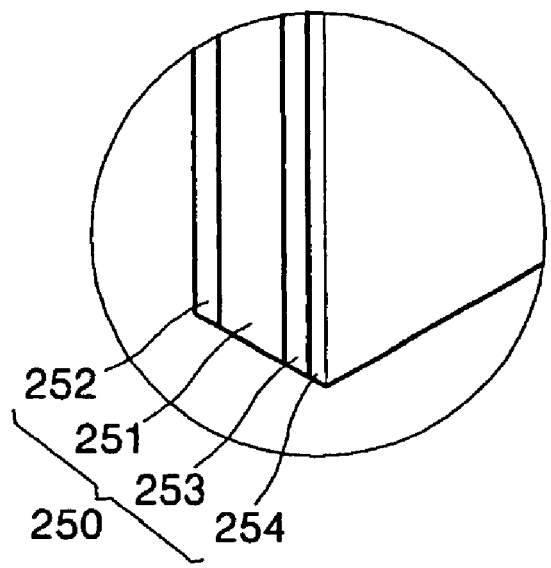
FIG. 2B is a magnified view of portion A in FIG. 2A focusing on an edge of the filter 11 assembly.

Turning now to FIGS. 2A and 2B, FIG. 2A is an exploded perspective view of a plasma display panel 200 according to an embodiment of the present invention and FIG. 2B is a magnified portion of A in FIG. 2A. Referring to FIGS. 2A and 2B, the plasma display panel 200 includes a panel assembly 210 that includes a rear panel 212 located facing the front panel 211.

When the plasma display panel 200 is a three electrode surface discharge type plasma display panel, the front panel 211 includes a pair of discharge sustaining electrodes that includes an electrode and a Y electrode, a front dielectric layer that buries the pair of discharge sustaining electrodes, and a protection film layer coated on a surface of the front dielectric layer. The rear panel 212 includes an address electrode located in a crossing direction with the pair of discharge sustaining electrodes, a rear dielectric layer that buries the address electrode, barrier ribs that define discharge spaces, and fluorescent layers of red, green, and blue colors coated on an inner walls of the barrier ribs.

A chassis base 220 is located on a rear of the panel assembly 210. The chassis base 220 is coupled to the panel assembly 210 by an adhesion member. The adhesion member may be a dual-sided tape. The chassis base 220 serves as a heat radiation sheet that acts as a heat transfer medium for radiating heat generated from the panel assembly 210 through the chassis base 220 during driving the panel assembly 210.

A driving circuit unit 230 is mounted on a rear surface of the chassis base 220. A plurality of circuit devices 231 are mounted on the driving circuit unit 230 and a flexible printed cable 240 is connected to the driving circuit unit 230. The flexible printed cable 240 transmits electrical signals between each of the electrode terminals of the panel assembly 210 and the driving circuit unit 230 by being connected therebetween. A filter assembly 250 for shielding electromagnetic waves, infrared rays, and neon light generated from the plasma display panel 200 and for reflecting external light is mounted on a front side of the panel assembly 210.

Case 260 includes a rear cabinet 262 that is perforated by ventilation holes and the front cabinet 261. Case 260 accommodates the panel assembly 210, the chassis base 220, and the filter assembly 250 between the front cabinet 261 and the rear cabinet 262.

A substrate 251 formed of transparent glass or plastic and included in the filter assembly 250. An anti-reflection film 252 for preventing the reduction of visibility due to the reflection of external light is attached on a front surface of the transparent substrate 251. The anti-reflection film 252 is treated with an anti-reflection (AR) processing. An electromagnetic wave shielding filter 253 is an electromagnetic interference (EMI) shielding filter for shielding electromagnetic waves generated from the plasma display panel 200 during driving thereof is located on a rear surface of the transparent substrate 251. A selected wave absorption film 254 is attached on a surface of the electromagnetic wave shielding filter. Selected wave absorption film 254 shields neon light having a wavelength of 590 nm and near infrared rays generated by a plasma of inert gas used when an image is displayed.

A filter holder 270 is mounted on a rear surface of the filter assembly 250. The filter holder 270 includes a pressing unit 271 that presses the filter assembly 250 with respect to a front cabinet 261 and a fixing unit 272 that is bent toward a rear side of the pressing unit 271. A plurality of coupling holes 273 are formed in the fixing unit 272. A filter mounting unit 280 is located on a rear surface of the front cabinet 261. The fixing unit 272 is located facing the filter mounting unit 280 and fixes the filter assembly 250 with respect to the front cabinet 261 by screw coupling. According to a feature of the present invention, the electromagnetic wave shielding filter 253 of the filter assembly 250 is formed of a metal mesh and the metal mesh includes at least one strike layer and a plating layer. The strike layer and the plating layer will now be described in detail.

Turning now to FIGS. 3A through 3G, FIGS. 3A through 3G are cross-sectional views illustrating a method of manufacturing an electromagnetic wave shielding filter according to an embodiment of the present invention. A metal plate 31 for electrolytic plating is prepared. The metal plate 31 for plating can be formed of a metal such as SUS, titanium, nickel, aluminum, or copper, and an alloy of these metals. Alternately, plastic or glass can be used (see FIG. 3A).

Figure 3A:
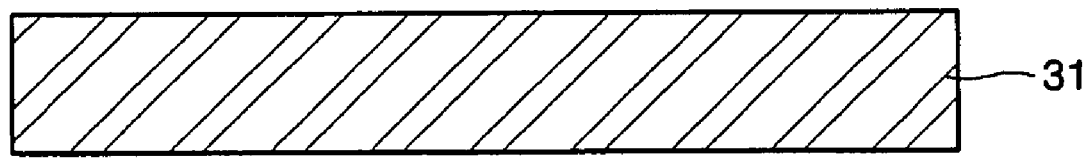
FIG. 3A is a cross-sectional view of a metal plate prepared according to an embodiment of the present invention.
Figure 3B:
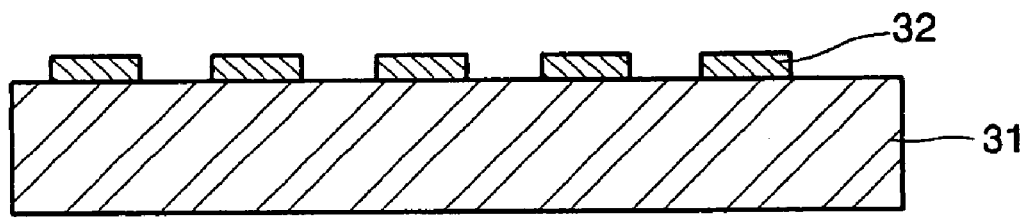
FIG. 3B is a cross-sectional view of the metal plate of FIG. 3A on which a photoresist layer is coated and patterned.

Next, a photoresist layer 32 is patterned on an upper surface of the metal plate 31 (see FIG. 3B). The patterned photoresist layer 32 has a pattern corresponding to a pattern for a metal mesh to be manufactured in a subsequent process. For this purpose, the photoresist layer 32 is exposed, developed, and hardened using a photomask having a mesh type pattern when a the photoresist layer 32 is coated on a surface of the metal plate 31. The region on which the photoresist layer 32 is formed is not plated. Plating occurs on portions that are absent the patterned photoresist. The thickness of the photoresist layer 32 is formed to be essentially equal to the thickness of the plating layer.

Figure 3C:
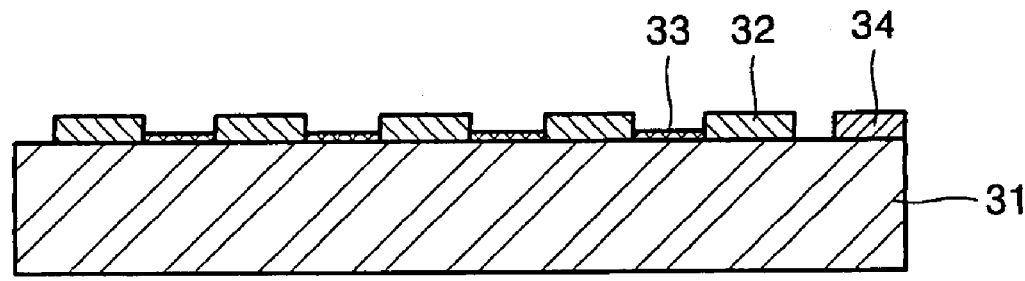
FIG. 3C is a cross-sectional view of the metal plate of FIG. 3B on which a strike layer is plated.
Figure 3D:
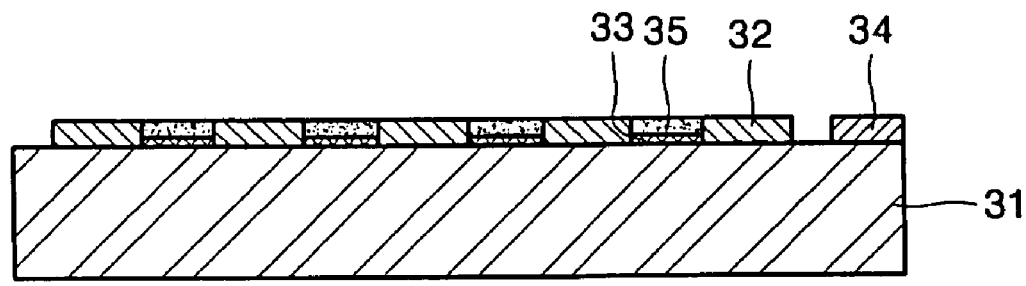
FIG. 3D is a cross-sectional view of the metal plate of FIG. 3C on which a plating layer is formed.
Figure 3E:
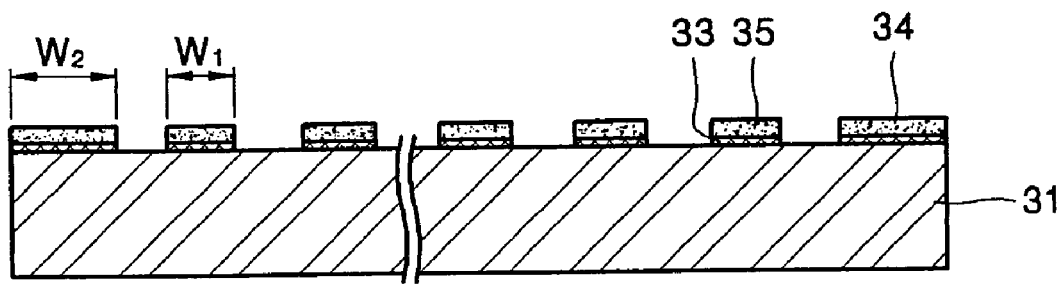
FIG. 3E is a cross-sectional view of the metal plate of FIG. 3D, from which the photo resist layer is removed.
Figure 3F:
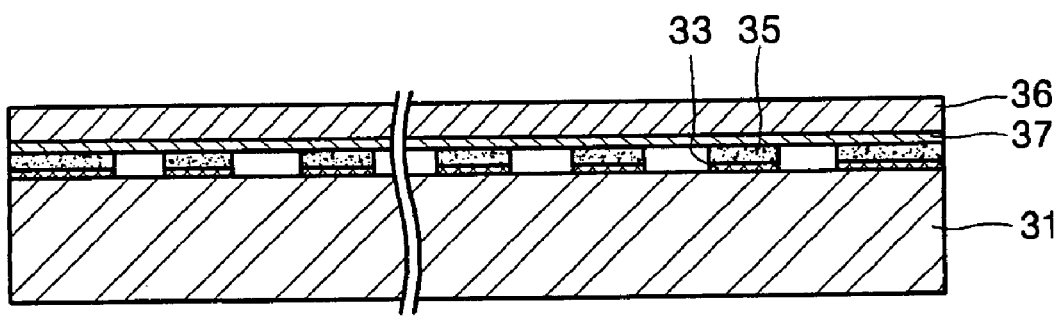
FIG. 3F is a cross-sectional view of the metal plate of FIG. 3E, on which a polymer film is attached.

Next, a nickel strike layer 33 is formed on the metal plate 31 (See FIG. 3C). The nickel strike layer 33 is formed so that oxides present on a surface of the metal plate 31 do not affect the plating.

At this time, an electrical contact point 34 is formed on the metal plate 31 so that the metal plate 31 becomes a cathode plate, and an anode plate is used as a nickel plate. The electrolytic solution contains nickel chloride 30-70 g/L and hydrochloric acid 5-20 ml/L, and a current with a density of 1-20 A/dm$^2$ is applied to the plating solution for 5-300 seconds.

Accordingly, the nickel strike layer 33 is plated on spaces on the surface of the metal plate 31 between the regions on which the photoresist layer 32 is formed. The nickel strike layer 33 is formed to serve as a seed layer or a catalyst for plating. When a plating layer is formed, any oxides on the metal plate 31 will not hinder the subsequent plating process since the nickel strike layer 33 is formed on a surface of the metal plate 31 to serve as the seed layer. Instead of using nickel for the strike layer 33, other metals can also be used. These include Cu, Fe, Al, Zn, Co, Mg, Cr, Cd, Ti, Ag, Au, In, along with alloy combinations of these metals (see FIG. 3C).

After forming the nickel strike layer 33, a plating layer 35 is plated on the nickel strike layer 33. The plating layer 35 is preferably a material having high conductivity, such as copper or silver, and having a thickness of approximately 10-15 micrometers. The ability to form the plating layer 35 on the metal plate 31 is not hindered by the presence of oxides on the metal plate because of the presence of the strike intermediate layer (see FIG. 3D). After forming the nickel strike layer 33 and the plating layer 35 on the metal plate 31, the photoresist layer 32 is removed. Thus, only the nickel strike layer 33 and the plating layer 35 in a mesh pattern remains on the upper surface of the metal plate 31 (see FIG. 3E).

Figure 3G:
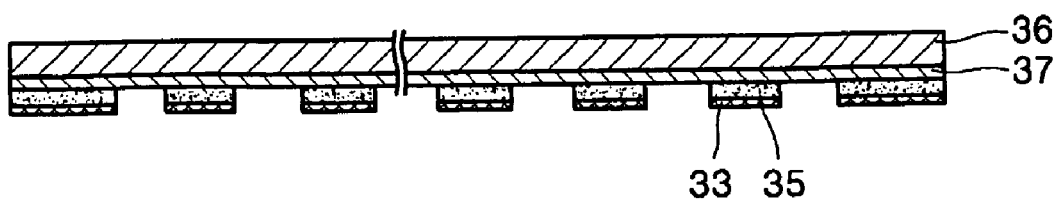
FIG. 3G is a cross-sectional view of the polymer film separated from the metal plate of FIG. 3F, on which a plating layer is attached.
Figure 4:
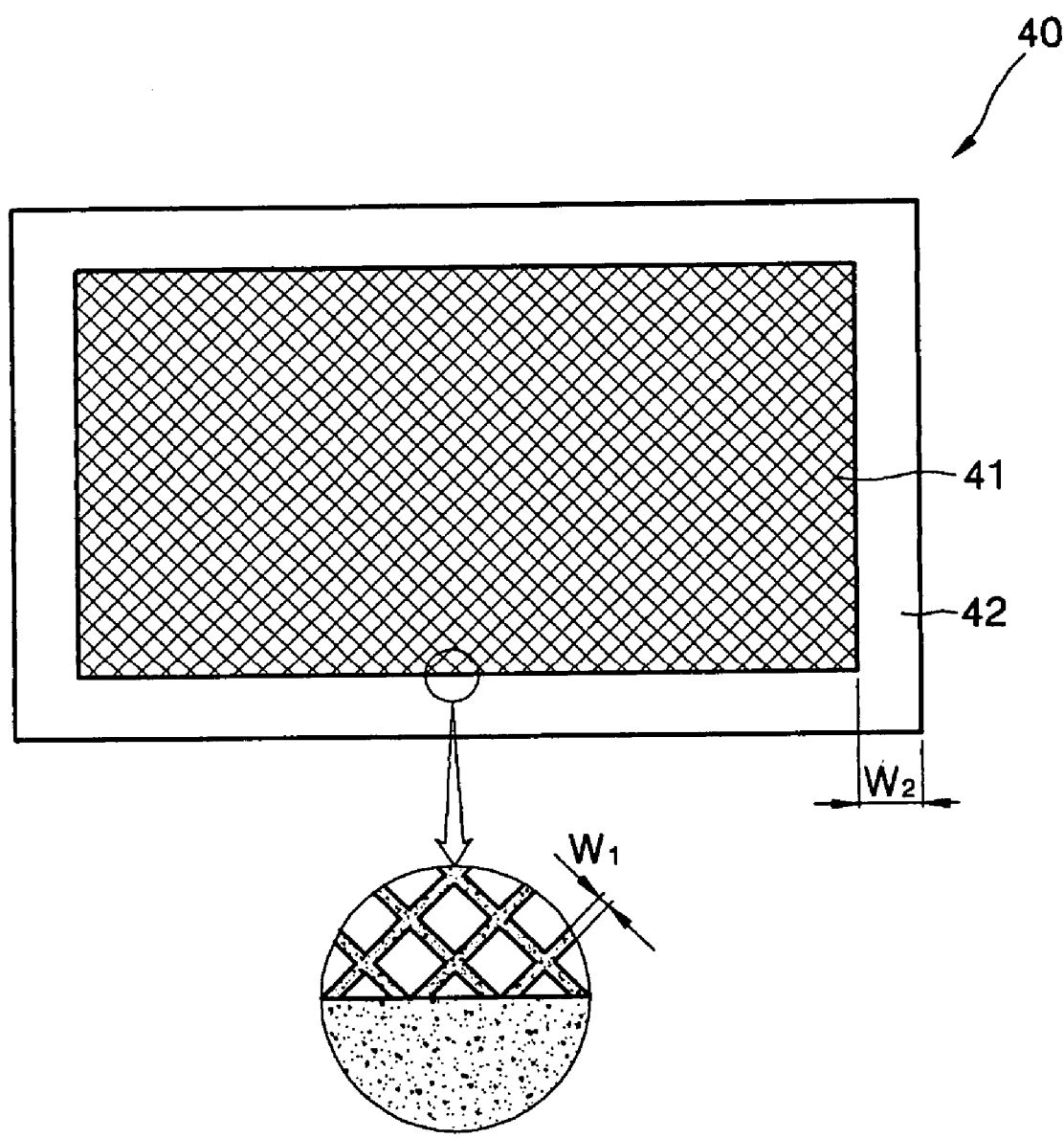
FIG. 4 is a magnified plain view of a portion of an electromagnetic wave shielding filter according to an embodiment of the present invention.

Turning now to FIG. 4, FIG. 4 is a magnified plan view of a portion of an electromagnetic wave shielding filter 40 according to an embodiment of the present invention. This electromagnetic wave shielding filter 40 is essentially the same as the electromagnetic wave shielding filter 253 of FIG. 2B. This electromagnetic shielding filter 40 is also essentially the same as the electromagnetic shielding filter in FIG. 3G to be discussed. The filter of FIG. 3G is a cross section of the filter 40 of FIG. 4. As depicted in FIG. 4, since the width $W_2$ of the edge portion 42 of the metal mesh of the electromagnetic wave shielding filter 40 is greater than the width $W_1$ of a portion 41 that forms the metal mesh. Use of a nickel strike layer 33 as a seed layer provides an electromagnetic wave shielding filter 40 that has improved uniformity and high density plating layer than if no strike layer is used.

After the nickel strike layer 33 and the plating layer 35 are formed on the metal plate 31, a polymer film 36, such as PET (or polyethyene terephthalate), having adhesion is applied to the plated side of the metal plate 31. At this time, a cohesive material 37 is coated on the lower surface of the polymer film 36 which attaches to the plating layer 35 (see FIG. 3F).

After attaching the polymer film 36 to the surface of the plating layer 35, the polymer film 36 is separated from the metal plate 31. When the polymer film 36 is separated from the metal plate 31, the nickel strike layer 33 and the plating layer 35 in a mesh pattern (hereinafter a double plating layer) is transferred to the lower surface of the polymer film 36 from the surface of the metal plate 31. This is because the bonding force between the cohesive material 37 of the polymer film 36 and the double plating layer is greater than the bonding force between the metal plate 31 and the double plating layer. Accordingly, the double plating layer can be separated from the metal plate 31. In this manner, the double plating layer structure made out of the nickel strike layer 33 and the plating layer 35 in a mesh pattern can be formed on a lower surface of the polymer film 36 (see FIG. 3G).

A blackening process for increasing contrast can further be performed on a surface of the double plating layer or a planarizing film for preventing the damage of the metal mesh can further be coated using an ultra violet hardening material. The polymer film with the plating layer of FIG. 3G can then become the electromagnetic wave shielding filter 253 of FIG. 2B and be attached to substrate 251 to form filter assembly 250. Also, the metal plate 31 can be reused after the double plating layer has been transferred to the polymer film 36.

As described above, the filter assembly for a plasma display panel and the method of manufacturing the filter assembly provides the following advantages. First, when forming a plating layer in a mesh pattern on the metal plate, the formation of a non-uniform plating layer by surface oxidation or the formation of a coarse plating layer can be prevented. Second, a dense texture of a plating layer that does not transmit light when inspecting a plating layer can be formed. Third, the yield of the product can be increased from 50% to 90% by forming a uniform plating layer using a strike layer. Fourth, manufacturing cost can be reduced since the metal plate for electrolysis can be used several times.

While the present invention has been particularly shown and described with reference to exemplary embodiments thereof, it will be understood by those with ordinary skills in the art that various changes in form and details may be made therein without departing from the spirit and scope of the present invention as defined by the following claims.

What is claimed is:

1. A filter assembly, comprising:
   a substrate; and
   an electromagnetic wave shielding filter attached to the substrate and comprising a polymer film and a metallic double layer structure arranged in a mesh pattern formed of a plurality of mesh-type metal meshes on the polymer film, wherein the metallic double layer structure comprises a strike layer and at least one plating layer on the strike layer,
   wherein the electromagnetic wave shielding filter further comprises an edge portion encircling the mesh pattern and the width of the edge portion is greater than that of the mesh-type metal mesh.

2. The filter assembly of claim 1, the metallic double layer structure is formed by the process comprising:
   preparing a metal plate for plating;
   forming a strike layer on the metal plate;
   forming a plating layer comprising at least one layer on an upper surface of the strike layer;
   attaching a highly cohesive polymer film on an upper surface of the plating layer; and
   separating the polymer film from the metal plate causing the plating layer to transfer to a lower surface of the polymer film.

3. The filter assembly of claim 2, the plating layer being arranged on the polymer film and the strike layer being arranged on the plating layer.

4. The filter assembly of claim 1, the strike layer comprising a metal selected from the group consisting of Cu, Fe, Al, Zn, Co, Mg, Cr, Cd, Ti, Ag, Au, In, Ni and an alloy of a combination of these metals.

5. The filter assembly of claim 1, the at least one plating layer comprising a material selected from the group consisting of copper and silver.

6. The filter assembly of claim 5, the plating layer being 10-15 micrometers thick.

7. A plasma display panel, comprising:
   a panel assembly;
   a chassis base comprising a driving circuit, the chassis base being arranged on a rear of the panel assembly;
   a filter assembly mounted in front of the panel assembly; and
   a case that accommodates the panel assembly, the chassis base, and the filter assembly, the filter assembly comprises a transparent substrate, an anti-reflection film and an electromagnetic wave shielding filter, the filter being arranged on a rear surface of the substrate, the filter being grounded to an inner side of the case, the filter comprising a mesh pattern formed of a plurality of metal meshes that comprises a double layer structure that comprises a plating layer,
   wherein the double layer structure comprises a strike layer and at least one plating layer on the strike layer,
   wherein the electromagnetic wave shielding filter further comprises an edge portion encircling the mesh pattern and the width of the edge portion is greater than that of the metal mesh.

8. The plasma display panel of claim 7, the metal mesh being formed by the process comprising:
   forming the plating layer in a mesh shape on a metal plate;
   attaching a highly cohesive polymer film to an upper surface of the plating layer; and
   separating the polymer film from the metal plate causing the plating layer to separate from the metal plate while remaining attached to the polymer film.

9. The plasma display panel of claim 8, the plating layer being arranged on the polymer film and the strike layer being arranged on the plating layer.

10. The plasma display panel of claim 7, the strike layer serving as a seed layer during electrolytic plating, the strike layer comprising a metal selected from the group consisting of Cu, Fe, Al, Zn, Co, Mg, Cr, Cd, Ti, Ag, Au, In, Ni and an alloy thereof.

11. The plasma display panel of claim 7, the at least one plating layer comprises a material selected from the group consisting of copper and silver.

* * * * *